US008475671B2

(12) United States Patent
Jalabert

(10) Patent No.: US 8,475,671 B2
(45) Date of Patent: Jul. 2, 2013

(54) METHOD FOR LOCAL ETCHING OF THE SURFACE OF A SUBSTRATE

(75) Inventor: Laurent Jalabert, Bessieres (FR)

(73) Assignee: Centre National de la Recherche Scientifique, Paris (FR)

(*) Notice: Subject to any disclaimer, the term of this patent is extended or adjusted under 35 U.S.C. 154(b) by 343 days.

(21) Appl. No.: 12/811,467

(22) PCT Filed: Dec. 23, 2008

(86) PCT No.: PCT/FR2008/001820
§ 371 (c)(1),
(2), (4) Date: Sep. 28, 2010

(87) PCT Pub. No.: WO2009/103907
PCT Pub. Date: Aug. 27, 2009

(65) Prior Publication Data
US 2011/0017705 A1    Jan. 27, 2011

(30) Foreign Application Priority Data
Jan. 3, 2008  (FR) .................................... 08 00035

(51) Int. Cl.
*C03C 15/00*      (2006.01)
*C03C 25/68*      (2006.01)
*C23F 1/00*       (2006.01)

(52) U.S. Cl.
USPC .................................. 216/41; 216/43; 216/45

(58) Field of Classification Search
None
See application file for complete search history.

(56) References Cited

U.S. PATENT DOCUMENTS

| 4,426,247 | A | * | 1/1984 | Tamamura et al. | ........... 438/702 |
| 4,826,564 | A | * | 5/1989 | Desilets et al. | ................ 216/49 |
| 7,087,444 | B2 | * | 8/2006 | Wong et al. | .................... 438/22 |
| 2006/0116001 | A1 | | 6/2006 | Wang | |
| 2007/0269883 | A1 | | 11/2007 | Uhrich | |

OTHER PUBLICATIONS

Kolari et al., "Tunable Hydrophilicity on a Hydrophobic Fluorocarbon Polymer Coating on Silicon," *Journal of Vacuum Science & Technology A—Vacuum, Surfaces, and Films*, vol. 24, Issue 4, Jul./Aug. 2006, pp. 1005-1011.
Nock et al., "Micro-Patterning of Polymer-Based Optical Oxygen Sensors for Lab-on-Chip Applications," *Proc. of SPIE*, vol. 6799, 2007, 10 pages.
International Search Report from International Appl. No. PCT/FR2008/001820, mailed Sep. 9, 2009.
Written Opinion from International Appl. No. PCT/FR2008/001820, mailed Sep. 9, 2009.

* cited by examiner

*Primary Examiner* — Duy Deo
(74) *Attorney, Agent, or Firm* — Alston & Bird LLP

(57) ABSTRACT

The invention relates to a method for the local etching of the surface of a substrate, characterized in that it comprises: a) making a gas-pervious polymer pad that comprises three-dimensional patterns on one surface thereof; b) contacting the surface including the pad patterns with the substrate; c) submitting the pad/substrate assembly to a plasma so that the species present in the plasma are accelerated and diffused through the pad until they reach the substrate.

18 Claims, 1 Drawing Sheet

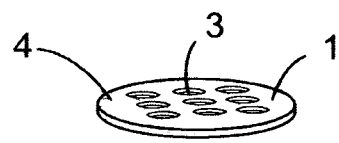
FIG.1a
FIG.1b FIG.1c FIG.1d
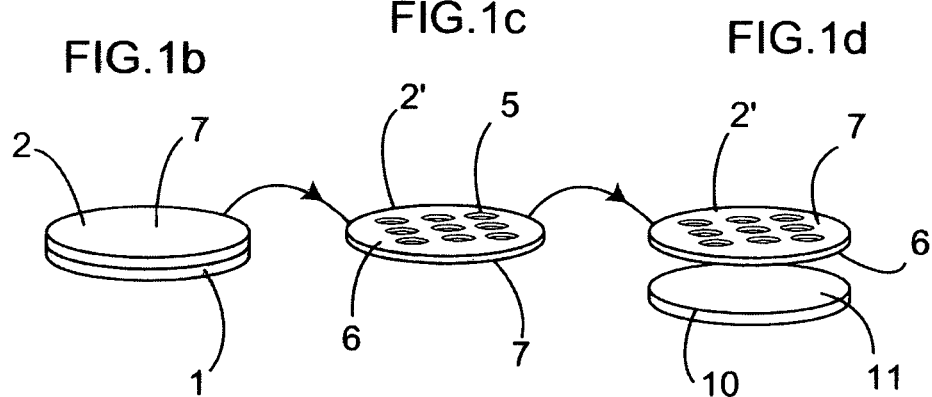
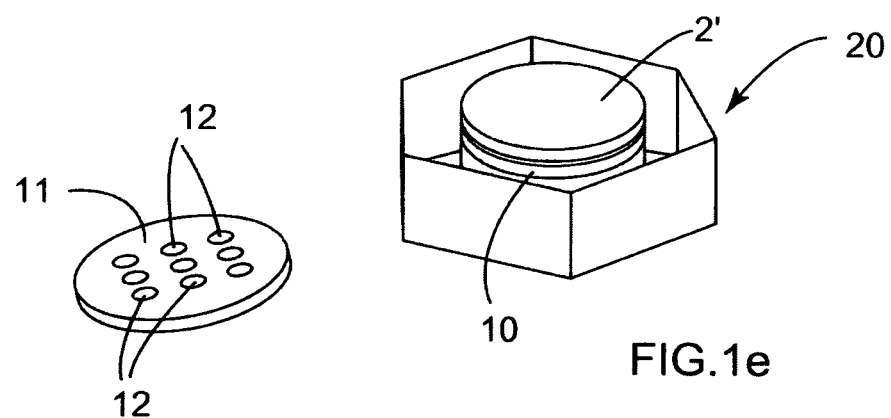
FIG.1f
FIG.1e

METHOD FOR LOCAL ETCHING OF THE SURFACE OF A SUBSTRATE

FIELD OF THE INVENTION

The present invention relates to a method of localized etching of a surface, in particular to create micrometric and nanometric patterns directly in a substrate.

BACKGROUND OF THE INVENTION

Methods of modifying the energy of a substrate using a plasma are already known.

United States patent application US 2007/0269883 (ULRICH) relates to a method of localized modification of the surface energy of a substrate in which a pad having through channels is brought into contact with a substrate, giving rise to localized treatment of the surface due to the fact that the radicals derived from the plasma can penetrate via the ends of the channels and treat the surface locally.

Similarly, United States patent application US 2006/0116001 (WANG) proposes raised patterns on a pad acting as a mask so that portions of the substrate that are left uncovered can undergo an energy modification treatment such as exposure to a plasma.

SUMMARY OF THE INVENTION

The idea on which the invention is based is to bring a substrate into localized contact with species (radicals, ions, atoms) derived from a plasma by using a selective interface in the form of a structured polymer pad through which the species can diffuse until they come into contact with the substrate, thereby locally modifying the surface energy and/or etching the substrate or a thin film deposited on a substrate, or etching a hydrophobic monolayer deposited by plasma on a substrate or on a thin film.

The invention thus provides a method of etching a substrate, the method being characterized in that it comprises:

a) producing a pad from a gas-permeable polymer that includes raised patterns;

b) bringing the raised patterns into contact with the substrate; and c) subjecting the assembly constituted by the pad and the substrate to a plasma such that species present in the plasma are accelerated and diffuse through the polymer from one surface of the pad to the substrate through the raised patterns in contact with the substrate.

The polymer may be an organic polymer, especially comprising polycarbon chains. In particular, it may be polydimethylsiloxane (PDMS), or any other polymer having the property of being permeable in a plasma, for example PPMS, PTFPMS, PPhMS, polychloroprene, PTEMA, polybutadiene (cis), polyisoprene, or a film of polyacetylene, or of phosphazene polymer, in particular PTFEP. The device having a surface topography is termed a pad.

The pad may have a thickness in the range a few micrometers to several millimeters, especially in the range 40 μm [micrometer] to 3 mm [millimeter], and more particularly in the range 100 μm to 1 mm. Advantageously, its thickness is selected so that it can be manipulated in step b) by an operative or by a machine.

The substrate, either bulk or in the form of a thin film deposited on a bulk substrate by conventional microelectronics techniques, may in particular be a metallic, insulating, semiconductive, and/or polymeric material.

The substrate may, for example, be formed from silicon or based on silicon, such as $SiO_2$, nitride, oxynitrides, or glass ("Pyrex", fused silica, quartz), or formed from a metal, in particular from Cu, Au, Al, ITO, Ni, Ti or Pt.

The gas or gases used to generate the plasma may be: $C_4F_8$, $CF_4$, $SF_6$, $CHF_3$, $N_2$, $O_2$, HMDS (hexamethyldisilazane) and/or HMDSO (hexamethyldisiloxane).

A fluorocarbon gas may be used to create a plasma that allows a layer of hydrophobic PTFE to be deposited.

An oxygen-based gas ($O_2$, $O_3$, for example) may be used to create a hydrophilic surface or to etch a polymer-based material (resins, etc) or to etch a layer of PTFE.

The method may be characterized in that the plasma contains reactive species that can etch the surface of the substrate and in that step c) is continued until said surface has been etched.

In particular, it may be characterized in that the surface of the plasma comprises a deposited layer and in that said etching consists in etching said deposited layer until an underlying layer or the substrate proper is reached.

Other characteristics and advantages of the invention become apparent from the following description made with reference to the drawings in which FIG. 1a to 1f illustrate an example of an implementation of the method of the invention to produce local hydrophobic and hydrophilic zones.

One application of the present invention relates to the possibility of locally modifying the surface energy of a material by localized etching of a hydrophobic monolayer previously deposited by a plasma method. One application example is described below, based on localized etching of said hydrophobic monolayer previously deposited by plasma onto a substrate covered with a deposit of copper, in order to allow the local growth of nanometric patterns formed by gold by electrochemical deposition.

Localized etching of this type is important as regards the development of alternative techniques for selectively depositing or growing metals on a substrate, or for localized etching of nanometric patterns into a substrate. In particular, the invention means that it is possible to dispense with known, time-consuming methods that combine electron beam writing onto a resin sensitive to electrons, developing the resin in a chemical developer to create openings on the substrate, depositing metal on the surface composed of resin patterns and openings on the substrate, then chemical etching of the resin to leave only the metal in contact with the substrate (lift-off method).

Bonding of biological products (proteins, DNA, cells, etc) or growth by electrochemistry depend on the surface energy of a substrate. In particular, bonding of biological molecules and electrochemical growth are preferentially carried out on hydrophilic surfaces. Thus, it is advantageous to have available a simple, rapid and reliable technique that can locally etch a substrate or a thin film, in particular that can locally etch a thin hydrophobic film deposited on an initially hydrophilic substrate to create as a result a localized modification of the surface energy of that substrate, in particular on a nanometric scale.

The invention is based on a combination of the plasma-assisted etching and deposition technique and of the technique of contact printing a polymer pad having a surface topography onto a substrate (termed micro-contact printing). According to the invention, radicals derived from a plasma diffuse through a polymer pad having a surface topography and being in contact with a substrate, to locally etch the substrate or a thin film deposited on said substrate.

The technique of micro-contact printing of a polymer pad having patterns on its surface onto a substrate is well known, in particular in order to locally deposit molecules initially fixed on the pad by immersion in a chemical solution. Immersing a pad in a chemical solution means that the whole of the polymer pad can be covered with monolayers of chemical solution. Because of the surface topography present on the polymer pad, during contact with a substrate, the monolayers of chemical solution are transferred onto the substrate from the patterns that are in contact with the substrate. In particular, if the monolayer of chemical solution is hydrophobic, as applies to monolayers based on OTS (ortho-trimethylsiloxane) and its derivatives, it is then possible to create hydrophobic patterns locally on a substrate once a polymer pad with a surface topography that has soaked up OTS by immersion in a chemical solution is brought into contact with said substrate.

The invention is based on an original combination of the technique of micro-contact printing and cold plasma surface etching.

A thin film of polymer with three-dimensional patterns on one face (termed a polymer pad) is brought into contact with a substrate so that the patterns present on the pad are in contact with the substrate. The assembly is placed in a cold plasma. The species (radicals, ions, atoms, etc) produced by the plasma diffuse through the pad to the substrate via the contact zones defined by the patterns of the polymer pad.

When the radicals from the plasma reach the substrate in a localized manner, localized etching of the substrate and/or a modification of the surface energy occurs that depends on the nature of the gas used in the plasma and on the nature of the substrate or the thin film that may be deposited on the substrate. The gases used in the plasma are selected so that a chemical reaction occurs between the radicals of the plasma and the substrate, to generate substrate etching.

One application of the invention relates to localized modification of the surface energy of a substrate. A thin hydrophobic film is deposited by plasma over the whole surface of an initially hydrophilic substrate, for example a substrate based on $SiO_2$ or any other material of surface that is hydrophilic. Plasma deposition of a thin hydrophobic film uniformly over the whole of a surface of a hydrophilic substrate can readily be achieved using a fluorocarbon gas of the $C_4F_8$ or $CHF_3$ type (without, however, being limited to these fluorocarbon gas types alone). The polymer pad is brought into contact with the substrate comprising a thin hydrophobic film so that the patterns present on the pad are brought into contact with the thin hydrophobic film present on the surface of the substrate. The patterns of the pad are not through openings, and the whole of the surface of the substrate can be covered by the polymer pad. An oxygen-based plasma can etch a thin hydrophobic film that has been plasma deposited on a substrate from fluorocarbon gases. The assembly is then subjected to an oxygen-based plasma, for example, so that the radicals derived from the plasma diffuse through the pad until they reach the thin hydrophobic film that has been deposited on the substrate. It becomes possible to locally create, on a substrate, hydrophobic and hydrophilic zones defined by the patterns of the polymer pad brought into contact with the substrate and subjected to a cold plasma.

One method of producing a polymer pad with patterns on one of its faces is described below. The polymer pad is obtained by molding a polymer on a rigid mold. The rigid mold comprises three-dimensional patterns on one of its faces. The three-dimensional patterns of the mold may be produced in two principal technical steps comprising a lithography technique and an etching technique without, however, being limited to the combination of these two techniques alone. Electron lithography, photolithography, or nano-printing are the most routinely used techniques for generating patterns in a resin deposited on a substrate (the resin is termed the masking resin). This resin acts as a mask against etching of the substrate. The substrate may be etched by a wet technique, by immersion in liquid chemical solutions, or by a dry technique such as cold plasma etching. After etching the substrate, the masking resin may be eliminated using surface cleaning techniques, either liquid or dry.

The polymer pad may, for example, be obtained from PDMS (polydimethylsiloxane) type polymers deposited on the surface of a mold comprising three-dimensional topography.

The PDMS type polymer may be in the liquid form (low viscosity) in order to take the exact shape of the patterns present on the mold. In order to obtain the patterns on the pad, the viscosity of the polymer in contact with the mold can be increased so as to make it suitable for manipulating and transferring onto the substrate. To this end, it is possible to add a chemical agent that encourages curing. Curing is in particular obtained by heat curing.

The method of curing the polymer pad thus depends on the properties of the chemical agent used and the curing conditions. As an example, a liquid polymer based on polydimethylsiloxane or PDMS (Dow Corning Sylgard 184) may be cured by adding a chemical agent based on tetramethyltetravinylcyclotetrasiloxane (Dow Corning, "Sylgard 184 curing agent"); when treated by heating, it can considerably increase the viscosity of the mixture in order to obtain a thin, flexible film that is at least partially cured, allowing the patterns of the pad to retain their dimensions when brought into contact with the substrate.

Producing a flexible pad from a PDMS type polymer is known in the fields of microfluidics and micro-nano-biotechnologies.

The polymer pad is then deposited onto a substrate so that the patterns in relief on the structured face are in contact with the substrate. This operation is similar to micro-contact printing without using molecular "ink".

The flexible pad-and-substrate assembly is then introduced into a plasma treatment rig. The plasma is generated from gas molecules ionized using capacitive sources (of the reactive ion etching (RIE) type, for example) or from high-density sources (of the electron cyclotron resonance (ECR), helicon, or inductive coupled plasma RIE (ICP-RIE) type, for example). Depending on the type of plasma source used, radicals present in the plasma may be in the form of ions, neutral species, or excited and/or partially ionized atoms or molecules. With a RIE source, the self-polarization voltage allows radicals to diffuse towards the substrate, the energy and density of the radicals essentially depending on the pressure and power of the single generator used to generate the plasma. With an ICP-RIE source, the energy of the radicals and the density of the plasma may be separately adjusted via two power generators.

The inventors have demonstrated that radicals of a plasma diffusing from the sheath towards the polarized substrate can also diffuse through the polycarbon chains of the polymer pad until they reach the substrate, although the plasma does not come into direct contact with the substrate beyond the zones where the patterns are in contact with the substrate. Two distinct regions appear after the plasma treatment and can be observed in an atomic force microscope, an optical microscope, an electron microscope, or by a water droplet condensation technique using a Peltier module to cool the surface of the substrate:

region A—region in which the patterns are not in contact with the substrate;

region B—region in which the patterns are in contact with the substrate.

In order to avoid said direct contact, the patterns present in the PDMS pad do not, for example, penetrate through to the ends of the pad. The periphery of the PDMS pad is thus in contact with the substrate.

After the plasma treatment, the pad is manually removed from the substrate. The patterns present on the polymer pad (pad brought into contact with the substrate and subjected to plasma treatment) are then transferred onto the substrate.

PDMS is a material that is particularly indicated for producing the flexible pad due to its ease of use and low cost.

The radicals created by the cold plasma may in particular be obtained from the following gases: $C_4F_8$, $CF_4$, $CHF_3$, $C_2F_6$, $SF_6$, $N_2$, $O_2$, $Cl_2$, $SiCl_4$, HMDS and/or HMDSO.

The substrate may have an initial surface energy (intrinsic, depending on the nature of the material/materials) and/or be pre-treated to uniformly modify the surface energy over the whole surface. The surface energy of a substrate may be initially modified by an overall treatment of the surface of a substrate, for example by immersing the substrate in a chemical solution, or by vapor phase treatment, or by cold plasma-assisted deposition, so that a thin film covers the whole surface of the substrate.

The substrate may advantageously have an intrinsic hydrophilic type surface energy (low contact angle, typically less than 10° for a deionized (DI) water droplet at 20° C.), hydrophobic (high contact angle, typically more than 90° for a DI water droplet at 20° C.) Substrates with an intermediate surface energy (typically in the range 10° to 90° for a DI water droplet at 20° C.) may be employed in the context of the present invention. The substrates may, for example, be formed from silicon, glass, plastic, metal or any type of thin film deposited on a substrate by evaporation, spraying, plasma-assisted deposition, spray deposition, spin coating or inkjet deposition techniques, etc.

A hydrophilic treatment may, for example be carried out using an oxygen-based plasma, from HMDSO or from HMDS, or by vapor phase treatment of HMDS in a chamber, for example of the YES-3TA or YES-5TA type from the supplier Yield Engineering Inc.

An oxygen plasma is routinely used to eliminate organic polymer type residues, in particular with the polymers used in a surface structuring method such as photolithography, electron beam writing, or nano-printing.

The oxygen plasma is also used to encourage bonding of PDMS type polymers to a substrate, in particular to modify the surface energy of PDMS by oxidation of its surface induced by oxygen plasma treatment. The treated PDMS has a hydrophilic surface that improves its adhesion to another polymer (it may also be PDMS) or a substrate, during contact of the PDMS polymer with the substrate. Another technique of improving the adhesion of the two PDMS films (bonding) consists in bringing the two PDMS films into contact, then subjecting the assembly to an oxygen plasma: the bonding of the two films is then so strong that the two films cannot be separated. These two techniques are frequently used in the field of micro-nano-biotechnologies, in particular for microfluidics applications.

A hydrophobic treatment over the entire surface of the substrate may be carried out by depositing polymers (especially PTFE) by plasma, for example from $C_4H_8$ or $CHF_3$ type fluorocarbon gases are routinely used in cold plasma methods. Depending on the residence time for the radicals from the plasma, which principally depends on the pressure and the flow rates of the gas stream(s) introduced into the chamber of a machine adapted to generate cold plasma, it is possible to etch a substrate or to deposit several monolayers of polymers, in particular layers based on $C_xF_y$ (especially $C_2F_2$) as they have the property of rendering the surface of a substrate hydrophobic. The radicals based on $C_xF_y$ are generated in a plasma using, for example, $CHF_3$ or $C_4H_8$ type fluorocarbon gases. The residence time may be calculated using the formula given in United States patent U.S. Pat. No. 6,749,763 (IMAI). It is, for example, in the range 1 millisecond to a few seconds, for example 5 seconds.

Polymers other than PDMS may be employed.

For this reason, apart from PDMS, silicone polymers such as those mentioned in the article by S. G. CHARATI and S. A. STERN "Diffusion of Gases in Silicone Polymers: Molecular Dynamics Simulations" published in Macromolecules, 1998, 31, p. 5529 to 5535, namely polypropyl methylsiloxane (PPMS), polytrifluoropropyl methylsiloxane (PTFPMS) and polyphenyl methylsiloxane (PPhMS), may also be used for carrying out the invention.

The article by P. TIEMBLO et al "Gas transport properties of crown-ether methacrylic polymers: poly(1, 4,.7, 10- tetraoxacyclododecan-2-yl) methyl methacrylate" published in Polymer 44 (2003), p. 6773-6780, in particular proposes (Table 4) polychloroprene, PTEMA, polybutadiene (cis) and polyisoprene.

Films of phosphazene polymers mentioned in the article by TAKUJI HIROSE et al "Gas Transport in Poly[bis(trifluoroethoxy) phosphazene)]—Journal of Applied Polymer Science, Vol. 38, p. 809-820 (1989)—exhibit good permeabilities to gases, especially $N_2$ and $O_2$, more particularly as regards PTFEP.

It is also possible to use films of polyacetylene such as those mentioned in the article by KOICHI TAKADA et al "Gas Permeability of Polyacetylenes Carrying Substituents)—Journal of Applied Polymer Science—Vol. 30, p. 1605 to 1616 (1985).

BRIEF DESCRIPTION OF THE DRAWINGS

FIGS. 1a to 1f illustrate the method.

DETAILED DESCRIPTION OF THE INVENTION

In FIG. 1a, a "master" silicon wafer is produced by lithography (electron beam or photolithography) followed by dry or wet etching to obtain the desired raised and recessed patterns over a depth that is, for example, approximately 100 nm.

The photoresist is then removed by dry or wet phase attack.

In FIG. 1b, a layer of plasma 2, for example PDMS, is deposited on the silicon wafer 1. The assembly is heated in an oven to bring about at least partial curing of the polymer.

In FIG. 1c, the pad 2' of at least partially cured polymer is unmolded and the raised patterns 3 of the face 4 of the "master" wafer 1 are reproduced as a negative 5 in the face 6 of the pad 2'.

The face 7 of the pad 2' that is not in contact with the wafer 1 is flat and the face 6 of the pad 2' has a topography 5 including positive nanometric patterns (studs, lines) that is the opposite of the patterns 3 of the face 4 of the wafer 1.

In FIG. 1d, the face 6 of the pad 2' is applied to the face 11 of a substrate 10 that has been pre-treated to render it hydrophilic or hydrophobic or that is by nature hydrophilic or hydrophobic.

In FIG. 1e, the assembly constituted by the pad 2' and the substrate 10 applied one against the other is introduced into an ICP-RIE (inductively coupled plasma-reactive ion etching) machine 20, for example an Omega 201 machine from the supplier Aviza Technology, provided with two radiofrequency sources at 13.56 MHz [megahertz] for separately controlling the plasma density and the energy of the radicals. It undergoes therein a treatment in a high-density plasma containing fluorocarbon molecules in order to produce hydrophobic patterns (on a hydrophilic face 11) or molecules of oxygen in order to produce hydrophilic patterns (on a hydrophobic face 11). The species generated by this plasma are not in direct contact with the substrate, but diffuse through the polymer to the interface with the substrate 10 in order to carry out a local treatment of the contact zones between the patterns and the face 11.

After unmolding (FIG. 1f), hydrophobic or hydrophilic zones 12 are present on the face 11; outside those zones, they are respectively hydrophilic or hydrophobic.

The examples below provide a better understanding of the implementation of the invention.

Step 1—Examples of Pre-Treatment of a Substrate by Plasma Deposition of a Thin Hydrophobic Film A hydrophobic layer may be deposited over the whole surface of a substrate using a cold plasma etching machine of the ICP-RIE (inductively coupled plasma-reactive ion etching) type such as the Omega 201 machine from the supplier Aviza Technology. By introducing $CHF_3$ gas into the ICP-RIE machine at a rate of 50 $cm^3$/min [cubic centimeter/minute], at a pressure in the range 30 mTorr [millitorr] to 50 mTorr and with a source/sample support power coupling of 500 W [watt]/20 W, the residence time for the radicals generated thereby is favorable to depositing a hydrophobic $C_xF_y$-based polymer. The composition of the $C_xF_y$-based hydrophobic polymer, namely the values of x and y, is not well defined in the literature. Occasionally, this composition is indicated as being $C_2F_2$. However, this type of deposit of a hydrophobic monolayer is very widespread, in particular in deep silicon etching methods (deep reactive ion etching).

Another example of a deposit of a hydrophobic layer is routinely used in deep silicon etching methods (deep reactive ion etching) methods that involve, in succession, a cycle of deposition of $C_xF_y$ polymer from $C_4F_8$ gas followed by a silicon etching cycle using $SF_6/O_2$ gas. Deposition of the $C_xF_y$ polymer is then accomplished with a flow rate of $C_4F_8$ that is, for example, in the range 80 $cm^3$/min to 110 $cm^3$/min, a pressure in the range 10 mTorr to 20 mTorr, and a source/sample support power coupling of 600 W/0 W. It is important to note that the deposit of hydrophobic polymer $C_xF_y$ obtained from a plasma generated from dissociation of $C_4H_8$ gas in the electromagnetic field induced by application of radiofrequency power to the source (coil) is efficient when the power applied to the support substrate (bias) is zero, i.e. 0 W. In other words, under these conditions, there is no directional bombardment of radicals towards the substrate since the power applied to the support of the substrate is zero. If the power applied to the substrate support is ideally more than 10 W, typically 50 W, bombardment of the substrate by $C_xF_y$ type radicals becomes effective, leading to a phenomenon of etching of the substrate rather than deposition of a hydrophobic layer.

Step 2—Example of the Preparation of a Polymer Pad

PDMS (Sylgard 184) was introduced into a beaker, then the curing agent (for example Sylgard Curing Agent) in a proportion by weight of approximately 10%. The assembly was mixed and placed in a vacuum jar for 5 minutes, for example, in order to degas the air bubbles formed in the mixture during homogenization of the PDMS and its curing agent. This degassed, homogeneous mixture was to be used within a few hours (and at most within one day) from its preparation.

Alternatively, the PDMS and its curing agent were mixed under vacuum and the mixture was stored under vacuum. Suitable machines exist; they are marketed by DOPAG MICROMIX (Cham-Switzerland). That type of equipment allows the time for preparation of the PDMS to be reduced by avoiding the mixing and degassing steps.

Step 3—Example of Filling a Mold with the PDMS/Curing Agent Mixture

The rigid mold comprising three-dimensional patterns on one of these faces may be manufactured from a silicon substrate onto which patterns have been transferred by a combination of the standard techniques of lithography and etching. The rigid mold is defined as being a "master" wafer.

If the homogeneous PDMS/curing agent mixture is simply cast onto the "master" wafer, its final thickness is not controlled, but in practice this is not an impediment to the success of the method.

For better uniformity of thickness, it may be spread onto the substrate using a "spin-coating machine". The method using the spin-coating machine employs a machine with a flat disk onto which a substrate is placed and held at its center by suction. A liquid is deposited on the substrate manually or using a pipette or an automated system. The disk is then rotated. It is possible to obtain different thicknesses of the polymer as a function of the rotational rate of the disk. Depending on the rate of rotation, typically between 500 rpm [revolutions per minute] and 10000 rpm, of the "spin-coating machine", and the viscosity of the polymer, it is possible to obtain very thin films of PDMS of up to 40 μm in thickness, but precautions then have to be taken when manipulating them. For this reason, a thickness of the order of one millimeter appears to be the most advantageous compromise.

Once the PDMS has been cast into the mold, or coated over the mold using the spin-coating machine to control the final thickness thereby, the assembly is placed in an oven or on a hotplate so that the rise in temperature induces curing of the monomers present in the PDMS due to the curing agent.

Curing of the cast or coated PDMS is carried out for several hours (approximately 3 to 4 hours) between 50° C. and 80° C., or more rapidly at higher temperatures, for example approximately 10 min to 15 min at 110° C.

Step 4—Example of Contact of PDMS Pad with the Substrate

After the heat treatment to cure the PDMS on the mold ("master" wafer), manual unmolding is carried out to remove the PDMS from the "master" wafer. The studs and cavities initially present on the "master" wafer are transferred to the PDMS as cavities and studs respectively. The PDMS comprising the patterns following unmolding is termed the PDMS pad and is in the form of a thick transparent film. The face of the PDMS pad carrying the patterns (for example cavities and holes) is manually brought into contact with the surface of the substrate to be treated, avoiding the introduction of bubbles between the pad and the substrate.

Step 5—Demonstrating the Effect Obtained During Plasma Treatment of the Assembly Defined by the Pad in Contact with the Substrate Two examples are given below. The first example concerns the localized modification of the surface energy of a substrate starting from a PDMS pad comprising micrometric patterns: in this example, the effect produced is readily and rapidly observed by optical microscopy. The second example is aimed at demonstrating that the effect described by the invention is applicable on a nanometric scale. In this example, optical microscopic observation may not be conclusive because the localized modification of the substrate surface occurs in zones with nanometric dimensions. In order to overcome this difficulty, a technique of growing metals electrochemically was used. This type of growth occurs readily on a hydrophilic conductive substrate. In contrast, growth is more difficult on a hydrophobic surface with low conductivity.

EXAMPLE 1

Micrometric Patterns

The substrate, in this example a wafer of silicon, was covered with a 200 nm layer of $SiO_2$. The initial contact angle on the substrate was measured at 9°, providing evidence of the normal hydrophilic and intrinsic nature of the layer of $SiO_2$ covering the substrate surface.

After treatment of the substrate as in step 1, the contact angle was 110°, providing evidence of the hydrophobic nature of the $C_xF_y$ layer deposited by plasma. Steps 2, 3, and 4 were identical.

Thus, the substrate comprised a wafer of silicon covered with $SiO_2$ and with a thin hydrophobic film a few nanometers thick. The PDMS pad covered the whole wafer. The assembly was introduced into an Omega 201 ICP-RIE plasma etching machine in order to subject the pad surface to plasma.

Oxygen, $O_2$, was introduced into the chamber at a rate of 40 $cm^3$/min. The pressure was 25 mTorr. By applying a radiofrequency power of 500 W to the source (i.e. the coil surrounding the chamber of the ICP-RIE machine), $O_2$ molecules were dissociated into radicals based on an ionized oxygen atom. By applying radiofrequency power at 10 W for 3 minutes to the substrate support, the radicals were attracted towards the substrate.

In region A (non-contact) defined above, the radicals diffused through the PDMS to reach the hydrophobic layer covering the substrate, and thus etching of the hydrophobic layer covering the substrate occurred. As a consequence, in region A (non-contact), the layer of hydrophobic $C_xF_y$ was etched until it reached the hydrophilic layer of $SiO_2$.

In region B (contact) defined above, the radicals diffused through the PDMS to the hydrophobic layer covering the substrate. However, no modification of the contact angle was observed in this region.

When the PDMS pad was being removed, the substrate was characterized optically. The treated substrate was positioned on a Peltier cell connected to a 5° C.-100° C. range temperature controller. On cooling the substrate, droplets of water condense out from the atmosphere.

In hydrophilic region A (non-contact), micrometric droplets of water accumulated to form patterns identical to those present on the PDMS pad.

In hydrophobic region B (contact), no droplets could be formed.

In general, it is possible to create locally hydrophilic regions on the surface of an initially hydrophobic substrate in region A where the patterns of the PDMS pad were not in contact with the substrate during plasma treatment.

EXAMPLE 2

Micrometric Patterns

The substrate, in this example a silicon wafer, was covered with a 200 nm thick layer of $SiO_2$. The initial contact angle with the substrate was measured at 9.6°, indicating the usual hydrophilic intrinsic nature of the $SiO_2$ layer covering the substrate surface.

Thus, the substrate comprised a wafer of silicon covered with only hydrophilic $SiO_2$. Steps 2, 3, and 4 were identical. Step 1 was not used for this example.

The PDMS pad covered the whole wafer. The assembly was introduced into an Omega 201 ICP-RIE plasma etching machine in order to subject the pad surface to a plasma.

A mixture based on $C_4H_8/CHF_3$ was introduced into the chamber at respective flow rates of 80 $cm^3$/min and 50 $cm^3$/min. The pressure was 45 mTorr. By applying a radiofrequency at a power of 500 W to the source (i.e. the coil surrounding the ICP-RIE machine chamber), the $CHF_3$ molecules were dissociated into ionized $C_xF_y$ radicals. By applying radiofrequency at a power of 10 W for 3 minutes to the substrate support, the $C_xF_y$ radicals were attracted towards the substrate. These conditions favored the deposition of a hydrophobic monolayer.

In region A (non-contact) defined above, the radicals diffused through the PDMS pad to the hydrophilic $SiO_2$ layer covering the substrate.

In region B (contact) defined above, the radicals diffused through the PDMS pad until they reached the hydrophilic $SiO_2$ layer covering the substrate.

During removal of the PDMS pad, the substrate was characterized optically. The treated substrate was positioned on a Peltier cell connected to a 5° C.-100° C. range temperature controller. On cooling the substrate, droplets of water condensed out from the atmosphere: micrometric droplets formed in region A (non-contact). As a consequence, this region was hydrophilic despite the plasma treatment. In region B, no droplet water formation was observed. After plasma treatment, region B (contact) had become locally hydrophobic.

This example demonstrates the possibility opened up by the invention of creating locally hydrophobic regions on the surface of an initially hydrophilic substrate in region (B) where the patterns of the PDMS pad were in contact with the substrate during plasma treatment.

|  | Initial state of substrate | Plasma treatment | Region A (non-contact) | Region B (contact) |
| --- | --- | --- | --- | --- |
| Example 1 | Hydrophobic (monolayer) | $O_2$ | Modification. Hydrophilic (novel) | Modification. Hydrophobic |
| Example 2 | Hydrophilic ($SiO_2$ - 200 nm) | $C_4H_8/CHF_3$ | Unchanged. Hydrophilic | Modification. Hydrophobic |

In Example 1, modification of the surface energy in region A could be due to etching of the hydrophobic monolayer to a depth of several nanometers (deposited on the surface of the substrate during pre-treatment of the substrate) during the O2 plasma treatment of the substrate/PDMS pad assembly. Region B, apparently unchanged, could have undergone surface modification by migration of monomers derived from PDMS. These monomers, with a low molecular mass, were recently observed when micro-contact printing a PDMS pad with a surface; see the article by Christophe Thibault, Childérick Séverac, Anne-Françoise Mingotaud, Christophe Vieu, and, Monique Mauzac, "Poly(dimethylsiloxane) Contamination in Micro-contact Printing and Its Influence on Patterning Oligonucleotides", Langmuir 2007, 23 (21), 10706-10714.

In Example 2, the origin of the modification of the surface energy in region B could also be due to the migration of monomers derived from PDMS during the plasma treatment entrained by diffusion of $C_xF_y$ radicals during the $C_4H_8/CHF_3$ treatment of the substrate/PDMS pad assembly. In region A, it is possible that etching to a depth of a few nanometers occurred in the layer of SiO$_2$, and not over the whole initial thickness of the SiO$_2$. For this reason, region A thus retained its hydrophilic nature.

EXAMPLE 3

Local Growth of Metal on Nanometric Scale

The electrochemical growth of metal proceeds as follows. A substrate of metal or coating of a thin metallic film acting as an electrode is immersed in a bath containing metal ions of the metal that is to be deposited onto the substrate by the electrochemical method. In the electrochemical bath, by applying a current to the substrate, the metal ions contained in the solution exchange electrons with the conductive surface of the substrate. During this exchange of charges, the metal ions of the metal that is to be deposited are thereby transformed into metal atoms and are deposited on the surface of the substrate.

When there is no possibility of charge exchange between the surface of the substrate and the solution comprising the metal ions of the metal that is to be deposited, the electrochemical reaction is then limited if not impossible.

Photosensitive resin patterns may be produced on the conductive substrate to mask zones on the surface and thereby limit the exchange of charges during the electrochemical deposition method.

The invention demonstrates the possibility of locally modifying the surface energy of a conductive substrate to limit the exchange of charges between the conductive substrate and metal ions during a method of depositing metal electrochemically.

A deposit of gold was produced on a 4 inch (10.2 cm) wafer of silicon over the whole surface (full wafer).

The thickness of the deposit was not germane to the demonstration.

The wafer covered with the gold film was introduced into a plasma etching machine and a deposit as described in Example 1 was produced over the whole surface (full wafer). The contact angle was 101° (as opposed to 86° initially—no treatment).

The wafer was removed from the machine.

PDMS (10% curing agent—cured at 100° C.—15 min) was deposited onto another silicon wafer comprising nanometric patterns produced by electron beam then direct etching into the silicon over a depth of approximately 100 nm. During deposition, the liquid PDMS exactly matched the shape of the patterns etched in the silicon and cured during curing. The PDMS, with a thickness of about a few millimeters, was removed from the mold. Said PDMS was then termed a "flexible mold" and comprised positive nanometric patterns (studs, lines) on one of the faces.

The flexible mold, with sides of approximately 3 cm, was deposited on the wafer covered with gold and onto which several hydrophobic monolayers based on C$_x$F$_y$ had been deposited over the whole wafer (Example 1 described above). The studs and lines forming the patterns of the pad were not in contact with the gold surface covered with the hydrophobic monolayers. The edges of the flexible mold were in contact with the substrate so that the patterns present in the flexible mold were not in contact with the external medium (air).

The assembly was re-introduced into the etching machine and an oxygen plasma was applied for 3 minutes in order to render the zones that were not in contact hydrophilic. As a consequence, in the zone that was not covered with PDMS, the surface once more became highly hydrophilic as the oxygen plasma etched the C$_x$F$_y$ layer initially deposited by plasma (described in Example 1) to once again expose the gold (contact angle impossible to measure as the droplet was completely spread out). In the zone covered with the flexible PDMS mold, the hydrophobic zones of the substrate in contact with the patterns of the flexible mold remained hydrophobic under the action of the plasma that diffused through the material of the flexible mold. In the zones covered with the flexible mold and that were not in contact with the hydrophobic monolayers of the substrate because of the topography of the flexible mold, the surface energy was modified.

In order to verify that the non-contact zones between the PDMS and the gold had properly become hydrophilic, after removing the flexible mold, the wafer was placed in an electrochemical bath containing copper ions. Under the action of an electric current, the copper was preferentially deposited on the re-exposed hydrophilic gold layer but the gold covered with a residual hydrophobic layer was also covered with a deposit with a more reduced thickness (since the presence of hydrophobic zones created by the invention inhibited or limited the exchange of electrons between the copper ions and the film of gold covering the substrate). Total or partial inhibition of electron exchange between the substrate and the metal ions led to the selective deposition of metal on the substrate, or at least to a difference in the thickness of metal between the initially hydrophilic and initially hydrophobic zones of the substrate. In all circumstances, the method resulted in a contrast image observable by scanning electron microscopy due to the difference in topography between these various zones treated locally in accordance with the invention.

More generally, if a layer of PTFE is deposited by plasma on a substrate, then if the polymer pad comprising the patterns is brought into contact with this layer, then by applying an oxygen plasma, it is possible to locally etch the thin layer of PTFE in the region where the patterns are not in contact with the surface of the substrate and to reach the substrate or the layer deposited thereon.

EXAMPLE 4

Localized Etching of a Substrate

Etching a substrate over small depths (less than 10 nm, for example) is generally very difficult to control using ICP-RIE or RIE plasma etching techniques. Furthermore, plasma etching is known to generate defects in the substrates due to direct bombardment of the surface by the radicals derived from the plasma. The defects induced by dry etching are disastrous to the proper function of advanced electronic components.

By means of diffusion through the substrate, the invention means that localized etching of a substrate can be carried out over depths in the range from a few nanometers to several tens of nanometers, dispensing with direct bombardment of the substrate by radicals derived from plasma. The localized etching of a substrate does not require lithography and wet or dry etching techniques to be carried out on said substrate.

The PDMS pad including the patterns defined on one of these faces is brought into contact with a substrate, for example silicon. The assembly is placed in a plasma etching machine. The reactive gases are selected so that a chemical reaction between the substrate and the radicals derived from the plasma is possible so that the etching phenomenon is effective. SF$_6$ gas is particularly indicated for etching a silicon substrate.

After unmolding the pad, the appearance of patterns etched in the silicon is observed optically. The plasma or the reactive plasma species have passed through the pad and reached the substrate in a localized manner where the patterns are not in contact therewith and have etched the substrate locally. In the contact zones between the pad and the substrate, etching is not observed.

It is preferable for the height of the patterns of the pad to be greater than (or possibly equal to) the minimum width of the patterns, or in other words that the height/width aspect ratio of the pad patterns is greater than (or possibly equal to) 1.

The invention claimed is:

1. A method of localized etching of surface of a substrate, the method being characterized in that it comprises:
    a) producing a pad from a gas-permeable polymer that includes raised patterns on one of its faces;
    b) bringing the face of the pad comprising the patterns into contact with the substrate; and
    c) subjecting the pad/substrate assembly to a plasma which, apart from the zones where the patterns of the polymeric pad are in contact with the substrate, does not come into direct contact with the surface of the substrate, such that species present in the plasma are accelerated and diffuse through the pad until they reach the substrate.

2. A method according to claim 1, characterized in that said polymer is an organic polymer.

3. A method according to claim 2, characterized in that said polymer has monomers that are free or are bonded with other monomers.

4. A method according to claim 2, characterized in that the polymer is polydimethylsiloxane (PDMS).

5. A method according to claim 2, characterized in that the polymer is based on polydimethylmethacrylate (PDMA).

6. A method according to claim 1, characterized in that the polymer to which a curing agent is added while undergoing step b) is subjected to curing, ensuring at least partial curing.

7. A method according to claim 1, characterized in that the pad is in the range 40 µm to 3 mm thick.

8. A method according to claim 1, characterized in that the substrate is formed from Si or based on Si.

9. A method according to claim 1, characterized in that the substrate comprises a thin film on its surface.

10. A method according to claim 1, characterized in that the plasma comprises at least one of the following gases: $C_4F_8$, $CF_4$, $SF_6$, $N_2$, $O_2$, $Cl_2$, $CHF_3$, HDMS, and/or HMDSO.

11. A method according to claim 1, characterized in that the plasma is based on oxygen in order to create hydrophilic zones, or to etch a polymer-based material or a layer of PTFE.

12. A method according to claim 1, characterized in that the plasma is based on a fluorocarbon gas in order to create hydrophobic zones.

13. A method according to claim 1, characterized in that the plasma contains reactive species that are capable of etching the surface of the substrate and in that step c) is continued until said surface has been etched.

14. A method according to claim 13, characterized in that the surface of the substrate comprises a deposited hydrophobic layer and in that said etching consists in etching said deposited layer until an underlying layer or the substrate proper is reached.

15. A method according to claim 1, wherein the pad is in the range 100 µm to 1 mm.

16. A method according to claim 1, wherein the substrate comprises a thin layer of gold on its surface.

17. A method according to claim 1, wherein the substrate is selected from the group consisting of $SiO_2$, nitride, oxynitride, glass, and a metal.

18. A method according to claim 1, wherein the substrate comprises a metal selected from the group consisting of copper, gold, aluminum, nickel, titanium, and platinum.

* * * * *